(12) United States Patent
Wang et al.

(10) Patent No.: US 10,199,184 B2
(45) Date of Patent: Feb. 5, 2019

(54) ILLUMINATED SWITCHES AND INPUT BUTTONS

(71) Applicant: Apple Inc., Cupertino, CA (US)

(72) Inventors: Paul X. Wang, Cupertino, CA (US); Qiliang Xu, Livermore, CA (US); Aidan N. Zimmerman, Sunnyvale, CA (US); Chia Chi Wu, Taipei (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/447,070

(22) Filed: Mar. 1, 2017

(65) Prior Publication Data

US 2018/0082800 A1 Mar. 22, 2018

Related U.S. Application Data

(60) Provisional application No. 62/397,307, filed on Sep. 20, 2016.

(51) Int. Cl.
| | |
|---|---|
| *G06F 3/02* | (2006.01) |
| *H01H 13/02* | (2006.01) |
| *H01H 13/14* | (2006.01) |
| *H01H 13/83* | (2006.01) |
| *H01H 13/10* | (2006.01) |
| *H01H 13/88* | (2006.01) |
| *G06F 1/16* | (2006.01) |

(52) U.S. Cl.
CPC ......... *H01H 13/023* (2013.01); *G06F 1/1662* (2013.01); *H01H 13/10* (2013.01); *H01H 13/14* (2013.01); *H01H 13/83* (2013.01); *H01H 13/88* (2013.01); *H01H 2221/07* (2013.01)

(58) Field of Classification Search
CPC ....................................................... G06F 3/02
USPC .................................................... 361/679.01
See application file for complete search history.

(56) References Cited

U.S. PATENT DOCUMENTS

2012/0073941 A1* 3/2012 Chen .................. H01H 13/83
200/5 A

* cited by examiner

*Primary Examiner* — Jerry Wu
(74) *Attorney, Agent, or Firm* — Dickinson Wright RLLP

(57) ABSTRACT

This application relates to illuminated dome switches and a dome switch assembly having a first contact carried by a switch base and a dome shaped structure coupled to and supported by the switch base, the dome shaped structure comprising a material that is flexible and capable of internally transmitting visible light. The switch assembly can include a second contact coupled to the dome shaped structure and arranged opposite the first contact, and a light source configured to emit visible light, the light source in optical communication with the dome shaped structure such that at least some of the visible light emitted by the light source passes into the material and is subsequently emitted by the material in a generally uniform manner.

19 Claims, 14 Drawing Sheets

ILLUMINATED SWITCHES AND INPUT BUTTONS

CROSS-REFERENCE TO RELATED APPLICATIONS

This application claims the benefit of priority under 35 U.S.C. § 119(e) to U.S. Provisional Application No. 62/397,307, entitled "ILLUMINATED SWITCHES AND INPUT BUTTONS," filed Sep. 20, 2016, which is incorporated by reference herein in its entirety.

FIELD

The described embodiments relate generally to illuminated buttons and input switches. More particularly, the embodiments relate to switches, input buttons, keyboards and the like for electronic devices and computing devices that have designated illumination.

BACKGROUND

Electronic devices incorporate a variety of electrical components that can each provide different functions. A user's experience with an electronic device is one aspect of the operation and desirability of the electronic device. Illuminated input buttons and switches can enhance a user's experience in low light environments. At the same time, aesthetic is an increasingly important aspect of the user experience. Input buttons, keys and keyboards have been illuminated in the past, but configurations for conventional illumination do not always provide homogenous illumination across the input button, a key and/or even across an entire keyboard in some instances.

SUMMARY

Some embodiments of the present invention can include a dome switch assembly having a first contact carried by a base and a dome shaped structure coupled to and supported by the base, the dome shaped structure comprising a material that is flexible and capable of internally transmitting visible light. The switch assembly can include a second contact coupled to the dome shaped structure and arranged opposite the first contact as well as a light source configured to emit visible light, the light source in optical communication with the dome shaped structure such that at least some of the visible light emitted by the light source passes into the material and is subsequently emitted by the material in a generally uniform manner.

Some embodiments can include an illuminated keyboard for a computing device where the illuminated keyboard has a keyboard base suitable for carrying multiple input keys, each input key having a key cap arranged to interact with a dome assembly. The dome assembly can have a translucent dome supported by the keyboard base, the translucent dome as well as a light source embedded with the translucent dome and configured to emit light into the translucent dome such that at least some of the light emitted by the light source is emitted by the translucent dome and illuminates the key cap.

Some embodiments can include a method for assembling an illuminated keyboard including arranging a flexible dome, capable of collapsing under an applied force and having light transmitting characteristics, such that a first contact coupled to the flexible dome is opposite a second contact and such that the first contact can touch the second contact when the flexible dome is collapsed under the applied force. The method can include electrically coupling the first contact and second contact to a processor such that when the contacts touch a circuit is completed and a signal is sent to the processor. The method can include arranging a light source to be in optical communication with the flexible dome, the light source configured to emit visible light into the flexible dome the flexible dome configured to internally transmit visible light emitted by the light source and subsequently emit the visible light.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1A:
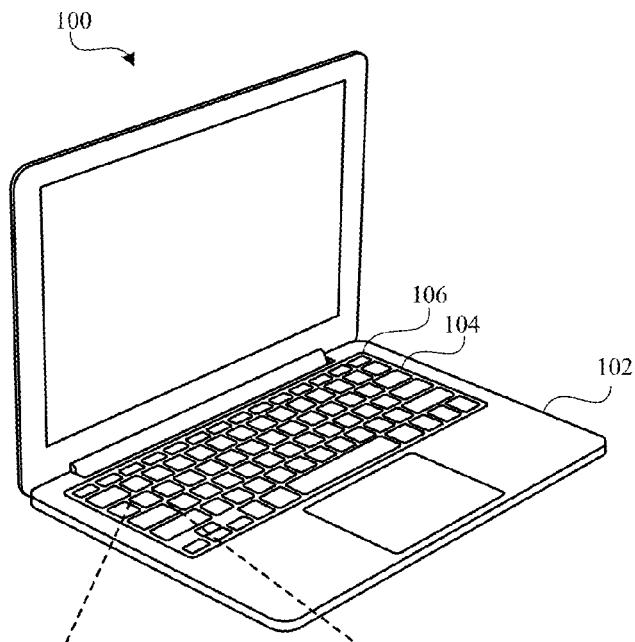
FIG. 1A illustrates an exemplary computing device that can utilize illuminated switches in accordance with the described embodiments.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting, such that other embodiments may be used, and changes may be made without departing from the spirit and scope of the described embodiments.

Many electronic devices have been designed to be more compact while also increasing functionality of the computing devices. Computing devices have also been designed to provide an improved user experience. Illumination can be provided to input buttons such as keys of a keyboard, on/off buttons, volume buttons and other types of input buttons. Exemplary electronic devices using input buttons in accordance with the described embodiments can include, but are not limited to, televisions, remote controls, laptop computers, desktop computers, portable audio players, smartphones, cellular phones, tablets, and wearable electronic devices, just to name a few. Input buttons of the described embodiments can have light transmitting indicia formed into the button such as letters for keys on a keyboard, which allows light to be emitted from the indicia so the operation of the button is readily ascertainable. In some embodiments, input buttons can be illuminated to emit light from around a perimeter of the input button. Embodiments of input buttons can include a switch configured to provide a signal to a processor when the switch is operated. Some switches can include flexible dome arranged under the input button surface, such as on a key cap of a keyboard, interacted with by a user. When the user interacts with the button (e.g., collapses, compresses, or depresses the button), the flexible dome structure made of a flexible material can collapse, allowing contacts within the switch to touch to complete an electrical circuit, or trigger optical sensor components that can generate a signal to be sent to a processor or other computing circuitry for operation of an electronic device.

In conventional illuminated input buttons and in circumstances where multiple buttons are arranged in a pattern on the computing device, such as keys of a keyboard, different configurations for illuminating all the keys have been used. In some conventional illuminated keyboards, a masked light-transmitting panel of material is arranged under an array of keys and light sources arranged at the perimeter of the keyboard project the light through the light-transmitting panel. The mask of the light-transmitting panel has apertures arranged to coordinate with the key locations, allowing light to escape through the apertures to illuminate each key. Even distribution of the light across the entire keyboard can be difficult to achieve, however, since some loss of light occurs through the light-transmitting panel. Alternatively, in some conventional devices, a single light sources can been arranged at each key to directly illuminate the key cap. In this circumstance, light leakage to adjacent keys can be hard to control and uneven distribution of light across the key itself can occur.

Embodiments of the present invention can include switches for use with input buttons, where each switch can be configured to provide illumination to the input button. Embodiments of switches can include dome switches that have a light source, such as an LED, arranged to emit light into the material of the dome structure of the switch to illuminate a button or key cap arranged over the switch. In some embodiments, the dome of a dome switch can be made of material having light transmitting properties and can be translucent. The light source can be arranged to project the visible light into the flexible dome material and subsequently be emitted out of the dome material in a generally uniform manner to illuminate the input button. In some embodiments, such as for keys of a keyboard, a key path control mechanism, such as a scissor mechanism, used in cooperation with the dome structure to control a key cap travel, can be made of a light transmitting material. A light source can be arranged to project visible light into the scissor mechanism and the scissor mechanism can subsequently emit the received visible light to illuminate the key cap. In some embodiments, both the dome structure and the scissor mechanism can receive and emit the visible light and, in some embodiments, the emitted light can be received from one or more light sources. In some embodiments, the light source, or light sources, can be embedded in the light transmitting material, such as within the dome structure or scissor mechanism. In some embodiments, a diffusor plate made of a light transmitting material can receive and internally transmit visible light, subsequently emitting the visible light to illuminate the input button or key.

More specifically, some embodiments can include a dome switch assembly having a first contact carried by a switch base and a dome shaped structure coupled to and supported by the switch base, the dome shaped structure comprising a material that is flexible and capable of internally transmitting visible light. The switch assembly can include a second contact coupled to the dome shaped structure and arranged opposite the first contact as well as a light source configured to emit visible light, the light source in optical communication with the dome shaped structure such that at least some of the visible light emitted by the light source passes into the material and is subsequently emitted by the material in a generally uniform manner.

In some embodiments, the light source is arranged at a base of the dome shaped structure and electrically coupled to a lead configured to at least transmit power to the light source. Some embodiments can include a key cap having an input surface and arranged over the dome shaped structure, wherein the light emitted by the dome shaped structure illuminates the key cap. In some embodiments, the key cap is configured to transmit at least some of the visible light emitted by the dome shaped structure to the input surface. In some embodiments, the key cap includes a masking that forms indicia at the input surface, the masking configured to block the light transmitted to the input surface and the indicia configured to emit the visible light transmitted through the key cap at the indicia. In some embodiments, the dome shaped structure comprises light guiding features to control where visible light is emitted from the dome shaped structure. In some embodiments, the dome shaped structure comprises masking at a portion of the dome shaped structure to prevent visible light from emitting from the portion of the dome shaped structure. In some embodiments, the dome shaped structure is made of a translucent rubber material. In some embodiments, the light source is embedded within the material of the dome shaped structure. In some embodiments, the light source is an LED. Some embodiments can include multiple light sources.

Some embodiments can include an illuminated keyboard for a computing device, where the illuminated keyboard has a keyboard base suitable for carrying multiple input keys, with each input key having a key cap configured to receive an input force from a user that interact with a dome switch assembly. The dome switch assembly can have a translucent dome supported by the keyboard base, the translucent dome configured to internally transmit visible light and emit the transmitted visible light. The dome switch assembly can also have a light source in optical communication with the translucent dome and configured to emit visible light into the translucent dome such that the translucent dome subsequently emits at least some of the visible light emitted by the light source in a generally uniform manner to illuminate the key cap.

In some embodiments, the key cap comprises masking defining indicia, the indicia configured to transmit the emitted light from the translucent dome and masking configured to block transmission of the emitted light from the translucent dome. In some embodiments, each dome switch assembly comprises a switch housing having walls that surround the translucent dome and the light source is arranged in one of the walls. In some embodiments, the dome switch assembly further comprises a scissor mechanism coupled to the housing and the key cap that causes the key cap to travel along a controlled path when receiving an input force from a user. In some embodiments, the translucent dome comprises light guiding features to control the locations on the translucent dome where visible light is emitted from the translucent dome.

Some embodiments can include a method for assembling an illuminated keyboard including arranging a flexible dome capable of collapsing under an applied force and having light transmitting characteristics, such that a first contact coupled to the flexible dome is opposite a second contact and such that the first contact can touch the second contact when the flexible dome is collapsed under the applied force. The method can include electrically coupling the first contact and second contact to a processor such that when the contacts touch a circuit is completed and a signal is sent to the processor. The method can include arranging a light source to be in optical communication with the flexible dome, the light source configured to emit visible light into the flexible dome, and the flexible dome configured to internally transmit visible light emitted by the light source and subsequently emit the visible light.

Some embodiments can include arranging a key cap scissor mechanism around the flexible dome. Some embodiments can include coupling a key cap to the flexible dome and to the scissor mechanism. In some embodiments, the flexible dome comprises a translucent rubber material.

These and other embodiments are discussed below with reference to FIGS. 1A-15; however, those skilled in the art will readily appreciate that the detailed description given herein with respect to these figures is for explanatory purposes only and should not be construed as limiting.

FIG. 1A illustrates a perspective view of one type of computing device 100 that can include a button 102, in this case a key cap, that is arranged to receive input from a user of the computing device 100. The computing device 100 can be any computing device not limited to a cellular phone, laptop computer, tablet computer, television, desktop computer, media player, remote control, watch, or any other device suitable for incorporating a switch. As shown here, the computing device 100 is a laptop computer and the input button 104 is a key of a keyboard 106 arranged in a laptop base 102. The input button 104 can include and utilize switches and input buttons of the described embodiments herein. Switches of the described embodiments can include illuminated dome structures. The illuminated dome structures may include switches where an electrical contact is carried by a flexible dome and the dome can be arranged over a second contact where, when the dome is compressed, the first and second contacts come into contact with each other and complete an electrical circuit that allows a signal to be provided to a processor for operation of the electronic device in which the switch is utilized (e.g., activating an input associated with a key coupled to the switch). Alternatively or additionally, the illuminated dome structures and/or switches may include optical components embedded therein such that, when the dome is compressed, the optical components detect changes and send signals to a processor for operation of the electronic device in accordance with designated operation of the switch (e.g., activating an input associated with a key coupled to the switch). In the described embodiments, the dome structure can be formed of a polymer that has light transmitting properties such that visible light emitted into the flexible dome structure material can be internally transmitted through the flexible dome structure.

Figure 1B:
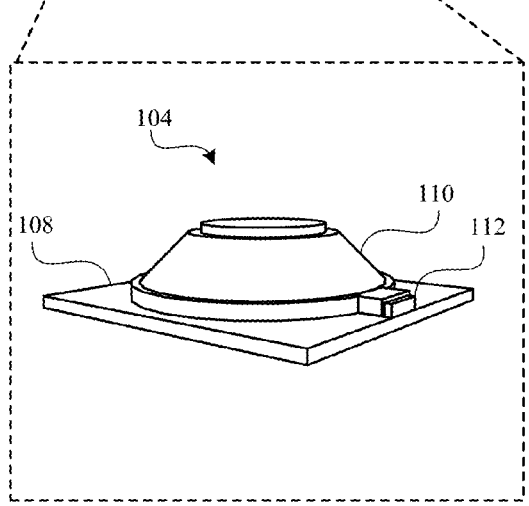
FIG. 1B illustrates a perspective view of an illuminating dome structure in accordance with the described embodiments.

FIG. 1B illustrates a perspective view of a mechanism associated with an input button 104 in accordance with the various embodiments. The input button 104 may include a flexible dome 110. Flexible dome 110 can be coupled to a base 108. A light source 112 can be arranged in optical communication with flexible dome 110 such that light emitted by the light source 112 can be emitted into the flexible dome 110 and transmitted internally. Light source 112 can be an LED or micro-LED among other suitable sources for providing visible light to the flexible dome 110. The light source 112 can include an arrangement of multiple LEDs, multiple micro-LEDs, quantum dots, and may be configured to emit various wavelengths of light, including but not limited to white light, RGB color light, infrared (IR) light, ultra-violet (UV) light, etc.

Figure 1C:
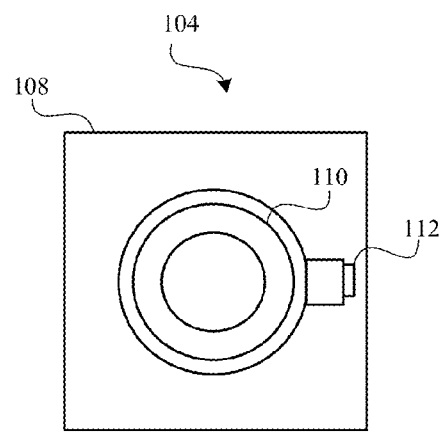
FIG. 1C illustrates a top view of the illuminating dome structure of FIG. 1B.

FIG. 1C illustrates a diagram of a top view of an input button 104 including a flexible dome 110. As shown here, light source 112 is arranged at an exterior portion of flexible dome 110 such that it can emit visible light into flexible dome 110. Light source 112 can be electrically and/or mechanically coupled to base 108, described in greater detail below.

Figure 2A:
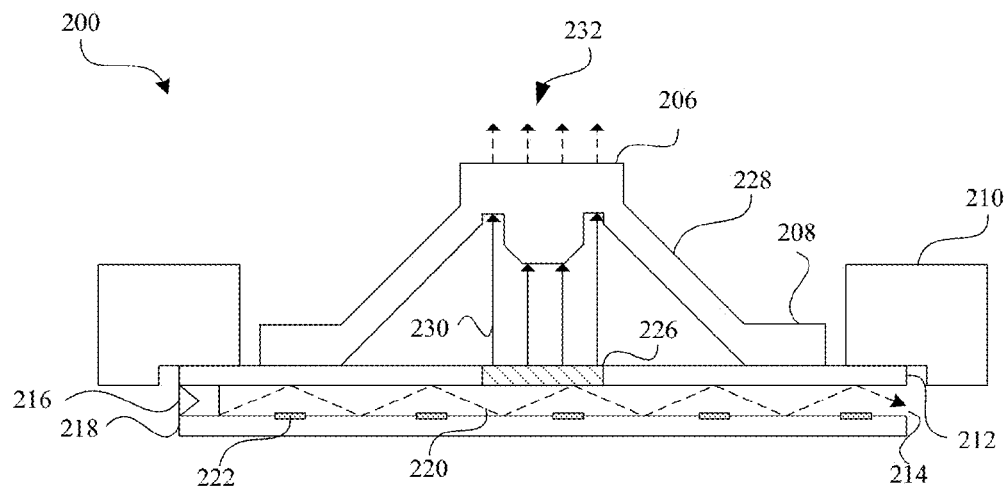
FIGS. 2A, 2B and 2C illustrate side views of illuminating dome structure configurations with light sources in accordance with the described embodiments.

FIG. 2A is a diagram of a side view of an input button switch configuration 200. The configuration 200 includes a flexible dome structure 206, end portions 210 (e.g., a scissor mechanism), a key base 212 and a bottom plate 218. The flexible dome structure 206 includes a base foot 208, a cone portion 228, and a top portion 232. The bottom plate 218 and the key base 212 are separated by a gap 214 which is used as a light guide to guide light 220 emitted from a light source 216 under the dome structure 206. The light guide 214 may also include light guiding features 222 to direct light to desired locations. The key base 212 may include a window 226 formed therein such that light 230 can be emitted from the light guide 214 and provide illumination of the configuration 200.

The configuration 200 of FIG. 2A has several drawbacks. The light guide 214 is typically configured to illuminate multiple input buttons along the path of the light guide, which causes light loss and degrades uniformity (e.g., some input buttons may have a different brightness than others). Further, it is difficult to uniformly illuminate wider or longer input buttons. Configurations such as 200 also do not have the ability to independently tune brightness, color, or other lighting properties. Thus, disclosed herein are improved switch configurations that achieve improved uniform lighting and independent tunable properties among other benefits as are described throughout.

Figure 2B:
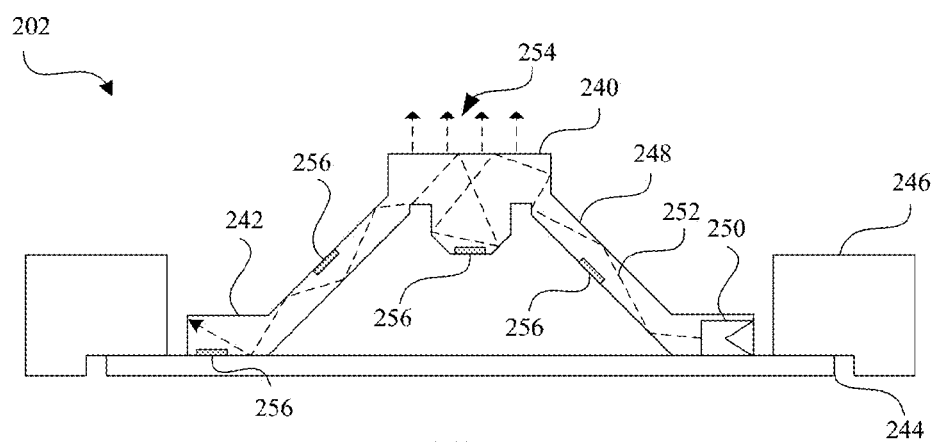
Figure 2C:
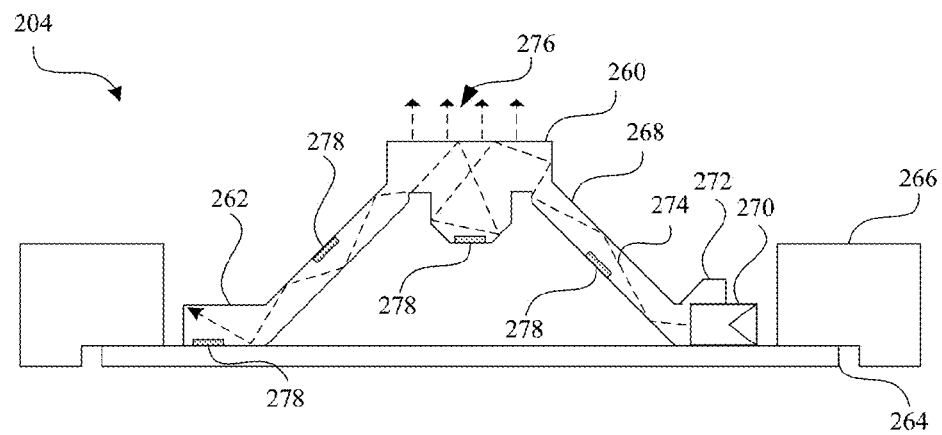

FIGS. 2B and 2C are diagrams of side views of illuminated dome switch configurations. Configuration 202 includes a flexible dome structure 240 having a top portion, a cone portion 248 and a foot base 242. The configuration also has a switch base 244 and ends 246. A light source 250 (e.g., an LED) that is positioned at the foot base 242 of the flexible dome structure 240. The flexible dome structure 240 may be constructed of a light emitting material. The light source 250 may be configured to emit light 252 throughout the flexible dome structure 240. The light 252 may be transmitted, reflected and guided by light guiding features 256 formed within the flexible dome structure 240. The light 252 may be emitted from the top of the flexible dome structure 240 such that the emitted light 254 may illuminate an input key (not shown) coupled to the flexible dome structure 240.

FIG. 2C shows a similar configuration 204 to configuration 202, including a flexible dome structure 260 with a coned portion 268 and a foot base 262, a base 264, ends 266 and a light source 270 configured to emit light 274 throughout the dome structure 260, where the light can be guided by light guide features 278 and emitted from the dome (e.g., emitted light 276). The light source 270 in configuration 204 is formed in such a way that light source 270 can be at least partially contained (e.g., with a portion exterior to the dome structure 260) within the flexible dome structure 260. In this way, foot base 262 can include lip 272 that is a raised portion that is positioned over the light source 270.

Figure 3A:
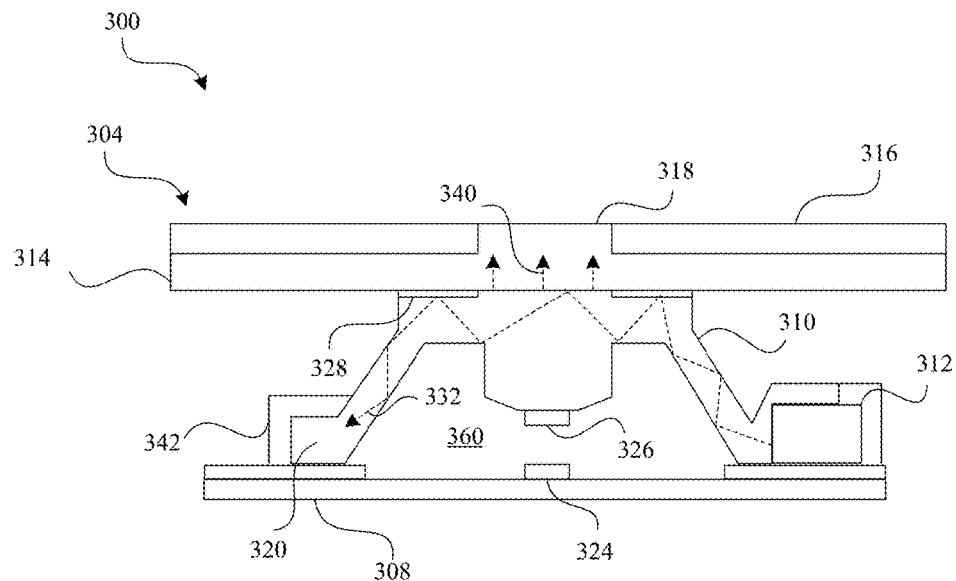
FIG. 3A illustrates a diagram of a side cross section of the illuminating dome structure and a button plate arranged over the illuminating dome structure.

FIG. 3A illustrates a diagram of a portion 300 of an input button 304 in accordance with the described embodiments of the present invention. A button plate 314, not shown in FIGS. 2B-2C, is shown in this view for clarity. As illustrated in FIG. 3A, the input button 304 can include a base 308 that carries a first contact (e.g., a base contact) 324. A flexible dome 310 can be connected to the base 308. A housing 342 can surround flexible dome 310. Here, flexible dome 310 is shown coupled to base 308 by way of foot 320. Flexible dome 310 can be made of a polymer material and have an internal volume 360 such that when a certain amount pressure is applied, the flexible dome 310 can yield and change shape and thus collapse. A second contact (e.g., a dome contact) 326 can be connected to the flexible dome 310. A button plate 310 can be coupled to the flexible dome 310 at an outer portion of flexible dome 310. As shown in FIG. 3A, in the rest position, the first contact 324 and the second contact 326 can be separated. The separation of the contacts 324 and 326 can be in part due to an amount of potential energy associated with the flexible dome 310. In this way, a weight of the button plate 314 can be arranged to not overcome the potential energy of the flexible dome 310 without some external force.

Figure 3B:
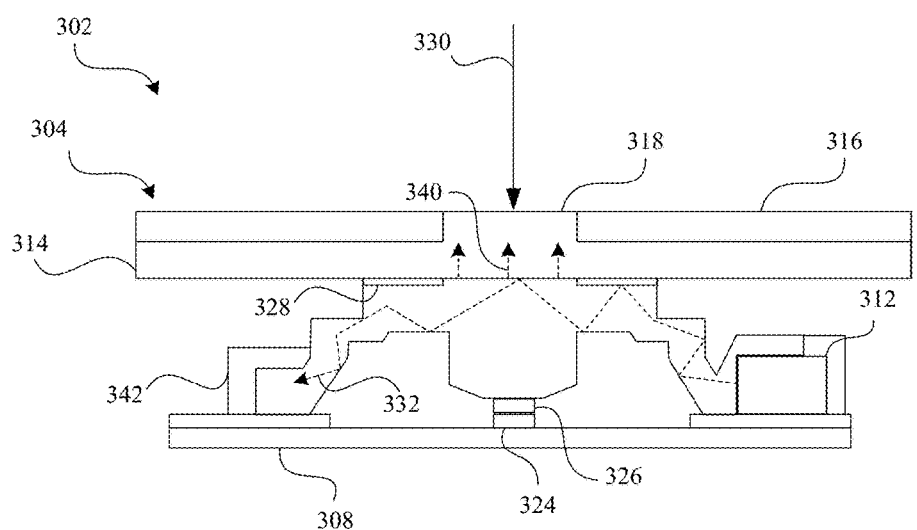
FIG. 3B illustrates a diagram of the illuminating dome structure of FIG. 3A in a collapsed or compressed position.

FIG. 3B illustrates a diagram of a portion 302 of the input button 304 being acted on by a force 330 and in a collapsed state. The input button 304 can be arranged such that the force 330 can be enough to overcome the potential energy associated with the flexible dome 310. Put alternatively, the force 330 is sufficient to cause the walls of the dome 3109 to buckle and push outward, thereby collapsing. As a result, the first contact 324 and the second contact 326 touch each other and complete an electrical circuit configured to provide a signal path to a processor.

As seen in FIGS. 3A and 3B, a light source 312 is coupled to base 308 via foot 320. In some embodiments, light source 312 can be coupled directly to base 308. Light source 312 is arranged such that it is in optical communication with flexible dome 310. Flexible dome 310 is formed of a material that is internally light transmitting, which means the material can receive visible light from a source (e.g., light source 312) and transmit and guide the emitted visible light throughout the flexible dome 310. In some embodiments, the material of flexible dome 310 can be a polymer material such as rubber or silicone. Flexible dome 310 can be formed of materials that allow at least some of the visible light that is transmitted and guided through the flexible dome 310 to be emitted from flexible dome 310 (e.g., emitted light 340). As such, flexible dome 310 can be translucent. As illustrated in FIGS. 3A and 3B, light source 312 is arranged adjacent flexible dome 310. Internal visible light 332, emitted from light source 312, can be seen internally reflected and guided within flexible dome 310 (e.g., via light guide components). In addition, light 340 (visible or otherwise) can be emitted from flexible dome 310. Since button plate 314 is arranged at and coupled to flexible dome 310, emitted visible light 340 is emitted toward button plate 314. Button plate 314 can be any surface, button or cap, such as a key cap, capable of receiving input from a user and transmitting an applied force from the user to the flexible dome 310 to cause flexible dome 310 to collapse.

Also, button plate 314 can be configured to be illuminated or receive and transmit emitted light. In this way, button plate 314 can be made of light conveying material and can be transparent or translucent. Button plate can have masking 316 that is configured to block transmission of visible light. The masking 316 can be formed in a manner that defines indicia 318 such that the emitted visible light 340 is emitted at indicia 318, and otherwise blocked by masking 316. In some embodiments, such as for a key cap for a keyboard, for example, indicia 318 can include letters, symbol, glyphs and the like. To control areas where emitted visible light 340 can be emitted from flexible dome 310, flexible dome 310 can have light guiding features 328 which can guide and/or refract light and prevent emission in a particular region. This can provide selective guidance and illumination of particular areas of the button plate 314 or otherwise provide for tuning of the illumination of the switch and/or input button 304. In some embodiments, the light guiding features can have light refractive properties.

Figure 4A:
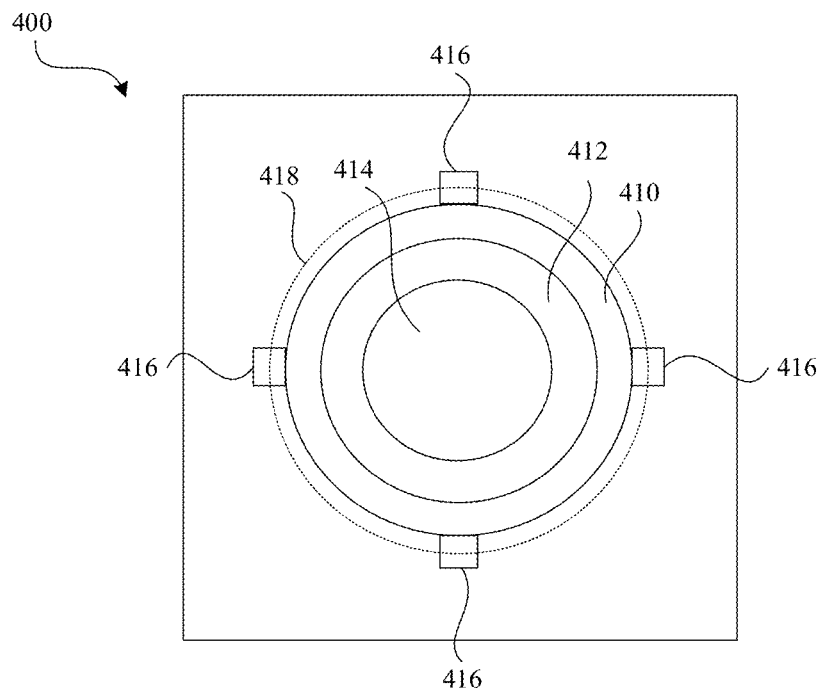
FIG. 4A illustrates a top view of an additional embodiment of an illuminating dome structure in accordance with the described embodiments.

FIG. 4A illustrates a top view 400 of an alternative embodiment of flexible dome 400 and light source 416. As shown, the flexible dome 400 includes a top surface 414, a coned portion 412, and a base potion 410 affixed to a base plate. Here, multiple light sources 416 are shown surrounding flexible dome 400 and can each emit visible light into flexible dome 400. Having multiple light sources 416 can allow for further tuning of the light emitted by flexible dome 400. For example, light sources 416 can be programmed to fire simultaneously, in a sequential pattern for providing dynamic illumination, or in tuned zoned illumination where particular light sources 416 are fired for particular operations, functions or input button configurations. As shown, the light sources 416 are dispersed at about every 90 degrees, although alternative dispersion frequencies may be utilized. The light sources 416 may be positioned outside of the base portion 410 of the dome 400 or, optionally, as shown by circle 418, positioned partially outside of the base portion 410 and partially inside of the base portion 410.

Figure 4B:
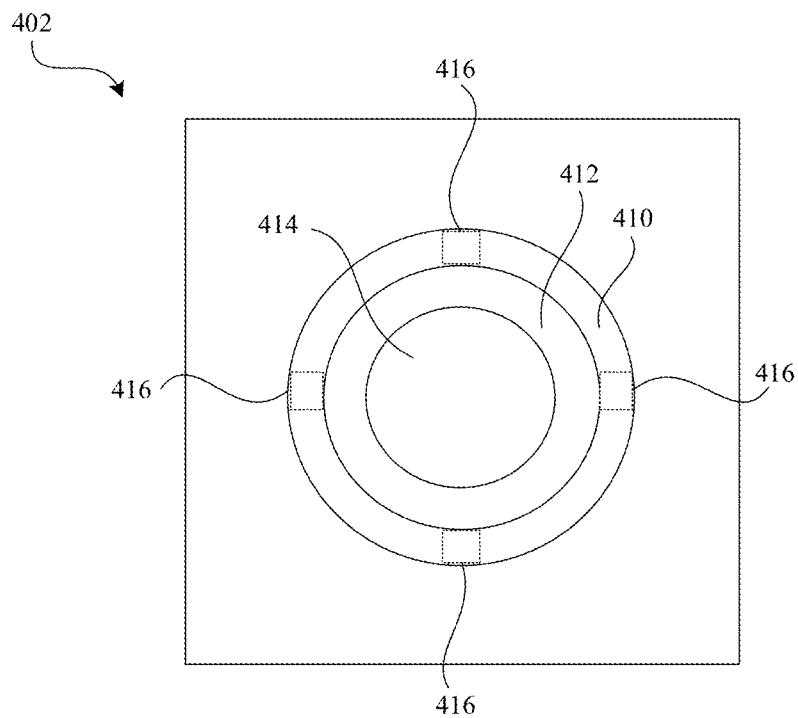
FIG. 4B illustrates a top view of an additional embodiment of an illuminating dome structure in accordance with the described embodiments.

FIG. 4B illustrates yet another top view of an alternative embodiment of flexible dome 402 and light sources 416. As seen here, multiple light sources 416 can be arranged under flexible dome 402 and/or embedded within flexible dome 402 (e.g., within the base portion 410, although the light sources 416 may be positioned on the interior of the dome 402 further inside from the base portion 410). This configuration can save lateral spacing in that the light sources 416 are not arranged adjacent the flexible dome 402. In some embodiments, flexible dome material can be over molded over light sources 416 (or in some embodiments a single light source 416) and leads, or an exposed contact surface of the light sources 416, can be provided for electrically connecting light sources 416 to a controller of an electronic device for powering and controlling firing of the light sources 416. It should be noted that the various light source configurations described herein could be used exclusively and/or in combination with one another, depending on the design constraints of the system and the desired illumination for the input button(s).

Figure 5A:
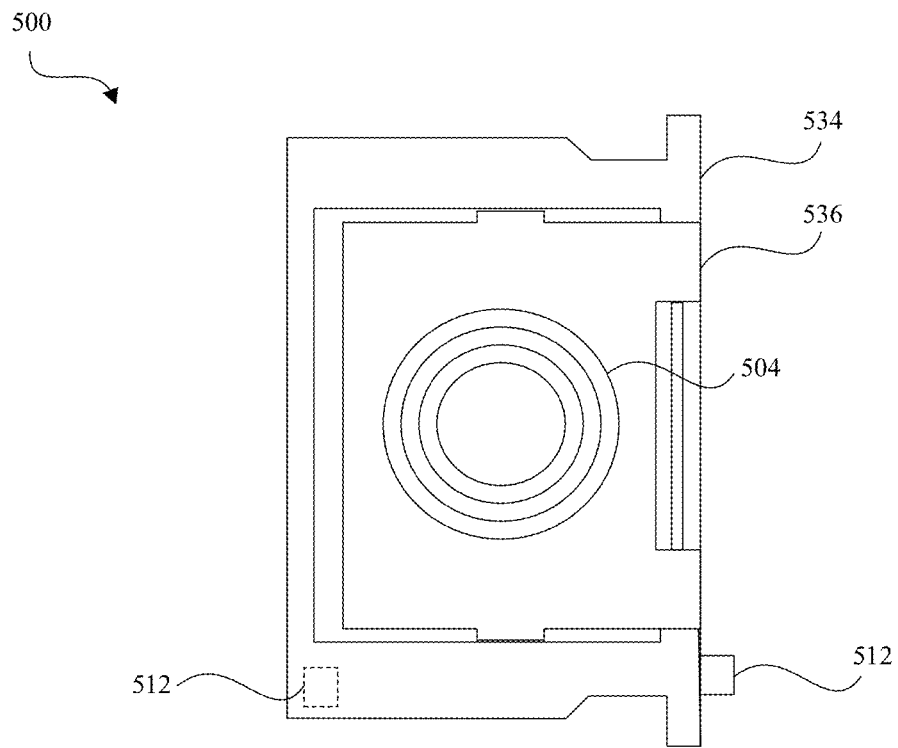
FIG. 5A illustrates a top view of a dome structure and an illuminating scissor mechanism in accordance with the various embodiments.
Figure 5B:
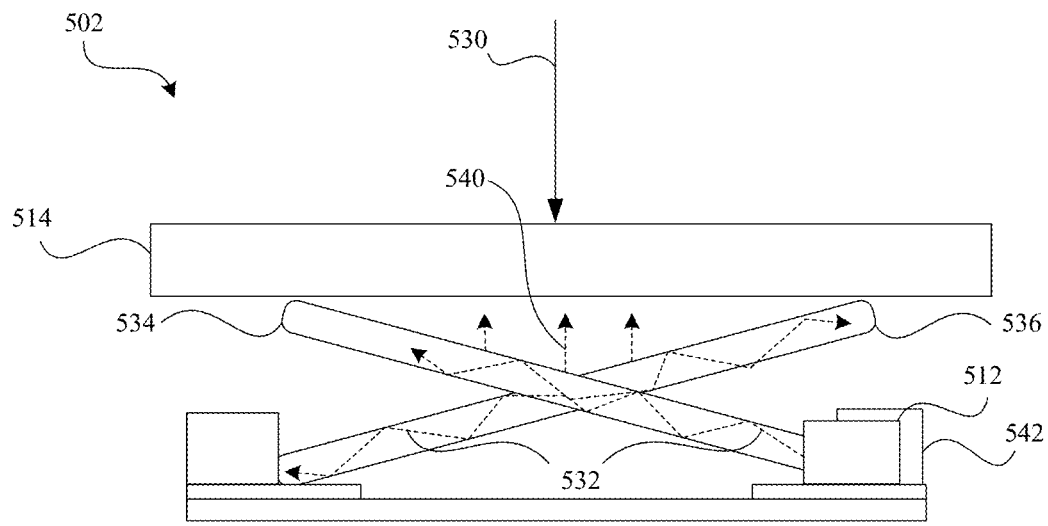
FIG. 5B illustrates a diagram of a side view of the illuminating scissor mechanism of FIG. 5A illustrating a key cap arranged over the illuminating scissor mechanism.

FIG. 5A illustrates a top view diagram of an alternative embodiment for illumination of a key assembly 500 for use with a keyboard, for example. FIG. 5B illustrates a diagram of a side view 502 of key assembly 500. Flexible dome 504 is shown centrally located and surrounded by a key travel control mechanism such as a scissor mechanism made of a first scissor component 534 and second scissor component 536. A key cap 514, not shown in FIG. 3A, is shown in FIG. 5B for clarity. Scissor mechanism (e.g., made up of scissor component 534 and scissor component 536) allows for a controlled travel of key cap 514 when a force 530 is applied to a surface of key cap 514 capable of receiving an input force, preventing key cap 514 from depressing unevenly. Scissor mechanism including first scissor component 534 and second scissor component 536 can be coupled to a housing 542 and key cap 514. While a scissor mechanism is shown here, alternative mechanisms for key travel control, such as a butterfly style mechanism and the like can be used. In FIG. 5B, a flexible dome is not illustrated for clarity. As can be seen, light source 512 can be arranged adjacent to and in optical communication with first scissor component 534 and/or second scissor component 536. First scissor component 534 and second scissor component 536 can be made of light transmitting materials having the ability to receive emitted light from the light source 512 and transmit and guide the visible light 532 throughout the first scissor component 534 and/or second scissor component 536. In a similar manner as previously described with regard to the flexible dome, the transmitted visible light 532 can be emitted by the first scissor component 534 and/or second scissor component 536 to illuminate key cap 514 with emitted visible light 540. As shown, light source 512 can alternatively or additionally be arranged on and/or embedded in the scissor mechanism. In some embodiments, light source can be arranged in housing 514. In some embodiments, light source 512 can be arranged external to housing 514.

Figure 6A:
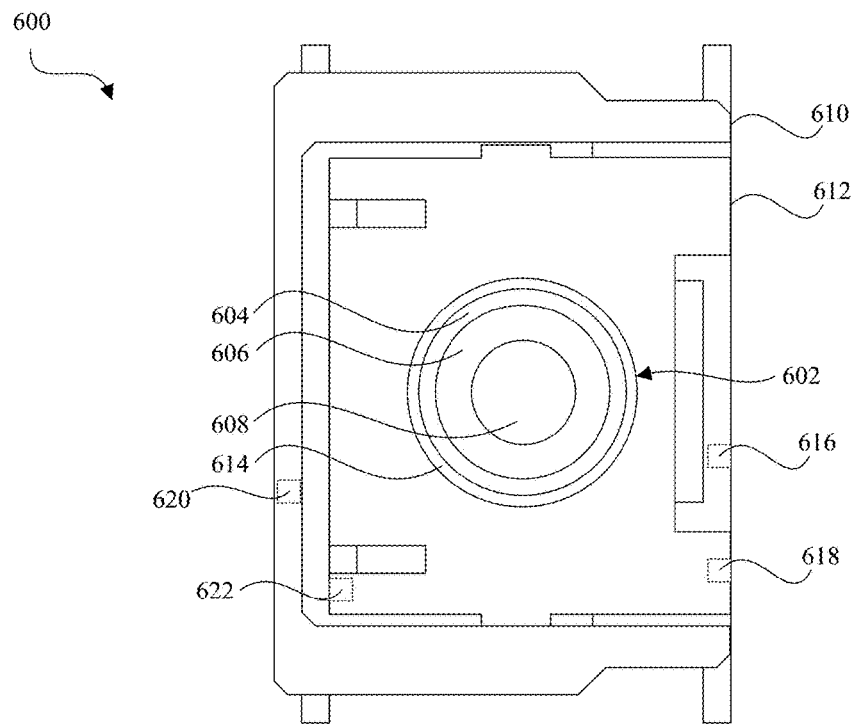
FIG. 6A is a top view of an example dome structure and scissor mechanism with light sources in accordance with embodiments of the invention.
Figure 6B:
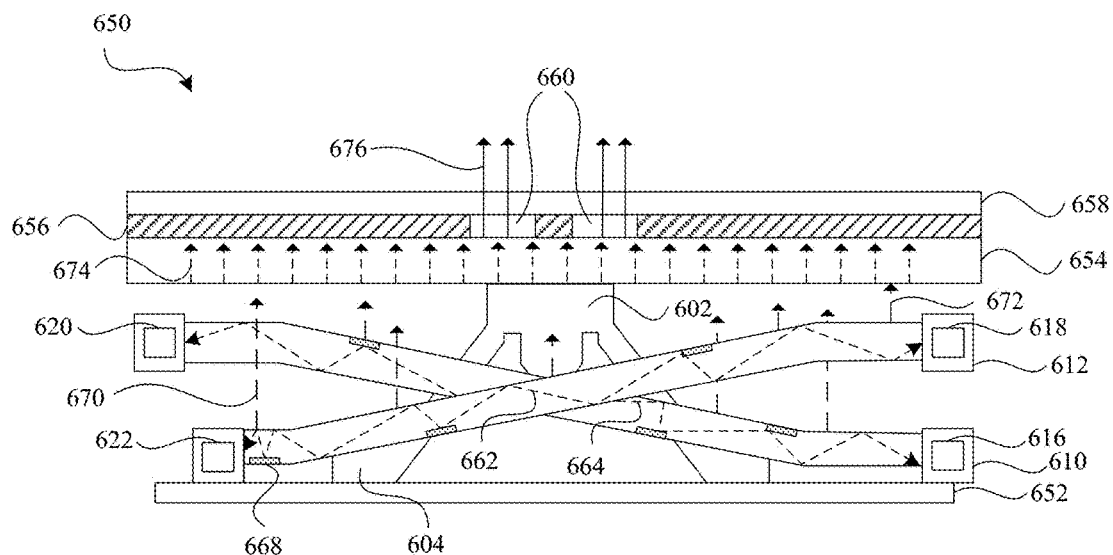
FIG. 6B is a cross-sectional side view of the example shown in FIG. 6A according to various embodiments.

FIGS. 6A and 6B illustrate another example key assembly by top view 600 and cross-sectional side view 650. The key assembly may include a flexible dome structure 602, and a scissor mechanism including a first scissor mechanism 610 and second scissor mechanism 612. The second scissor mechanism 612 may include an opening 614 through which the flexible dome structure 602 protrudes. The flexible dome structure 602 may include a top surface 608, a coned portion 606 and a base portion 604 that is affixed to a base. Beneath or within the scissor mechanism (e.g., first scissor component 610 and second scissor component 612) may be positioned light sources 616, 618, 620, 622.

As shown in cross-sectional view, the light source 618 may be positioned within one side of scissor component 612 and light source 622 may be positioned in another side of scissor component 612. Correspondingly, light source 620 may be positioned in one side of scissor component 610 and light source 616 may be positioned in another side of scissor component 610. Each of the scissor components 610, 612 may be constructed of a material capable of receiving light emitted from light sources and transmitting the received light, as is shown by light 662 through scissor component 612 and light 664 through scissor component 610. Each scissor component 610, 612 may include light guiding features 668 disposed on or within the components 610 and 612.

The scissor components 610 and 612 may be configured to transmit the light emitted from light sources 616, 618, 620, and 622, toward the key plate 654, as is shown by transmitted light 670 and 672. The key plate 654 may be positioned on top of the top surface 608 of the flexible dome structure 602. The key plate 654 may be constructed of a material such that it can transmit light received (e.g., the key plate 654 may be translucent). As shown in FIG. 6B, the key plate 654 receives the light 670 and 672 emitted from the scissor mechanism and transmits the light outward (e.g., light 674). Although not shown, the key plate 654 may also include light guiding features. A masking 656 may be disposed on the key plate 654 such that openings in the masking 656 form indicia 660 through which light 676 is transmitted. The key assembly may also include a protective surface 658 positioned or disposed over the key plate 654 and masking 656.

Figure 6C:
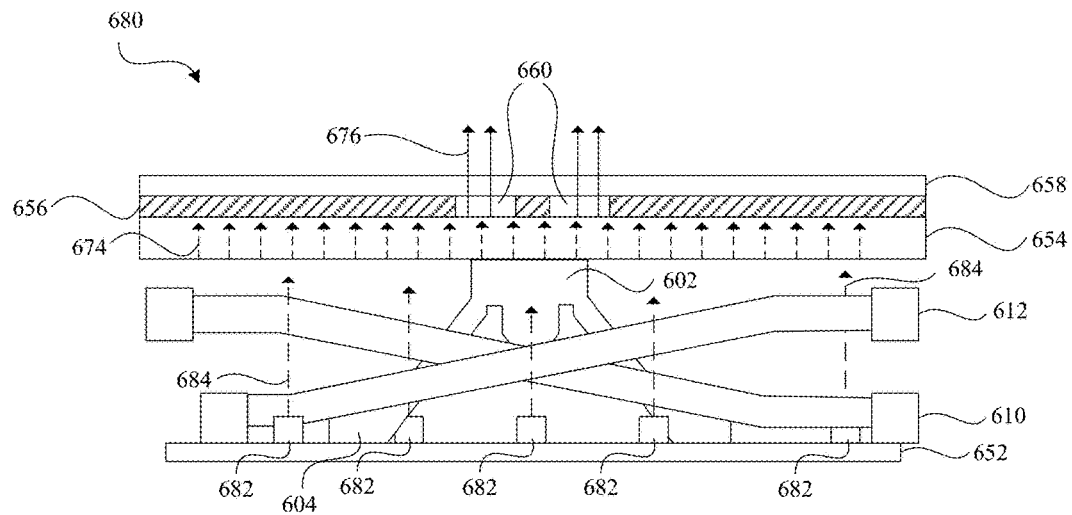
FIG. 6C is a cross-sectional side view of another example dome structure and scissor mechanism in accordance with the various embodiments.

In an alternative embodiment 680 shown in FIG. 6C, the base plate 652 of the key assembly includes multiple light sources 682 positioned thereon. The light sources 682 may be configured to emit light 684 in similar fashion to the light sources in FIGS. 6A and 6B, but positioned in a different location. In such embodiments, the scissor components 610 and 612 may be translucent such that the light 684 emitted from the light sources 682 may pass through the scissor mechanism to the key plate 654. Although separate configurations are shown in FIGS. 6B and 6C, it will be appreciated that both configurations may be utilized together and/or combinations of the configurations may also be utilized.

Figure 7:
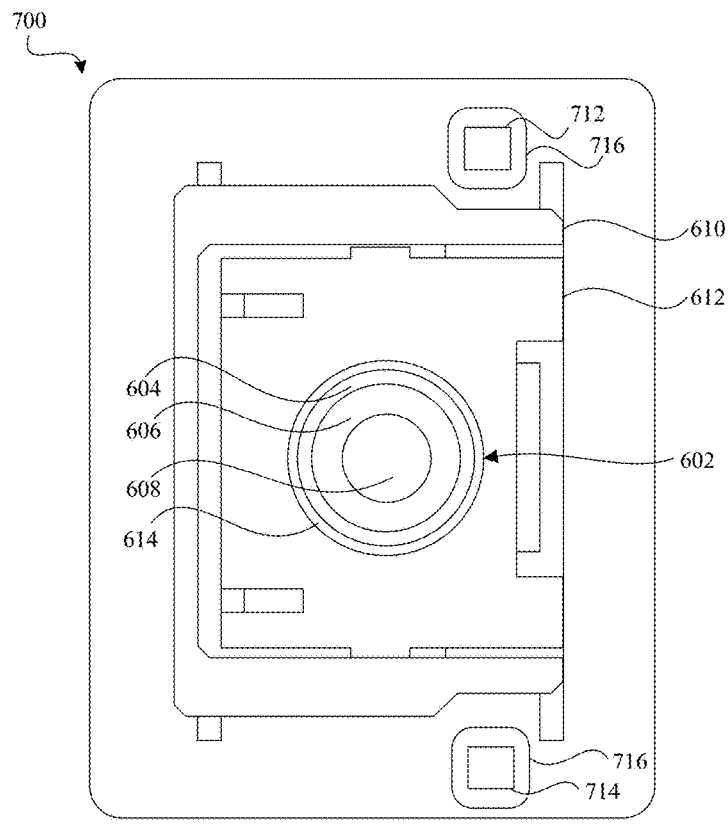
FIG. 7 illustrates a top view of a dome structure, scissor mechanism and illuminating diffusor in accordance with the various embodiments.

FIG. 7 illustrates top view diagram of an alternative embodiment for illumination of a key assembly 700 for use with a keyboard. Like in FIG. 6A, flexible dome 602 is shown surrounded by a scissor mechanism made up of first scissor component 610 and second scissor component 612. In this embodiment, diffusor plates 716 having light transmitting characteristics, like the flexible dome and scissor plates of previous embodiments, can transmit light received from light source 712 and 714 through diffusor plates 716, which can then be emitted to illuminate a key cap or button plate (not shown). It is important to note that each of the flexible dome, scissor mechanism and diffusor plate can be used alone or in combination with each other as the system design and considerations dictate, and while described separately, nothing precludes their combination.

Figure 8A:
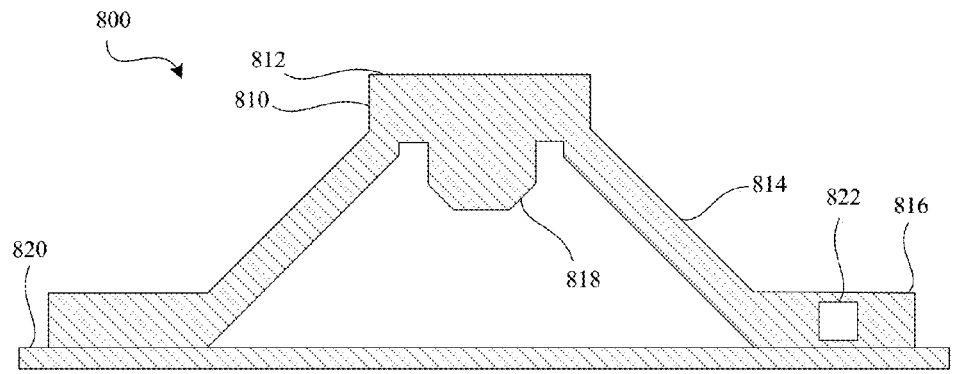
FIGS. 8A and 8B illustrate side cross-sectional views of additional embodiments of an illuminating dome structure molded over light sources, thereby having embedded light sources in accordance with the various embodiments.
Figure 8B:
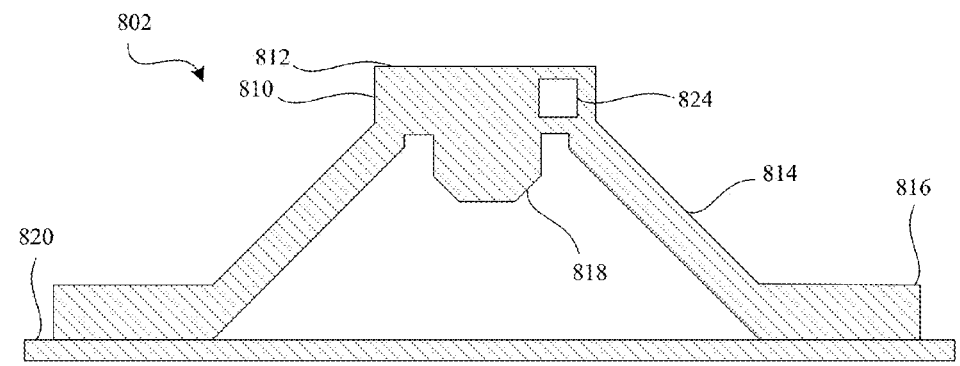
Figure 9:
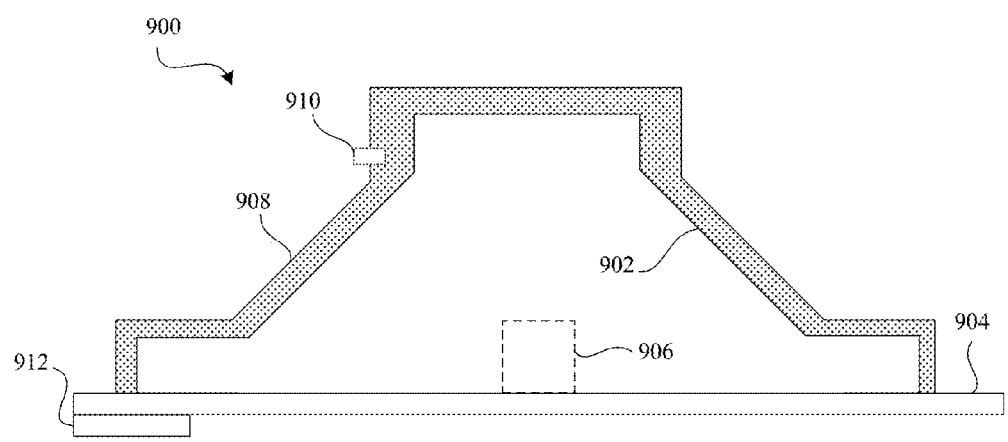
FIG. 9 is a side view of an illuminating dome structure having a conductive material formed over the dome structure in accordance with various embodiments.

FIGS. 8A and 8B illustrate alternative embodiments of a flexible dome 810 where the light source is embedded and suspended in flexible dome 810 material. Similar to other flexible domes disclosed herein, the flexible dome 810 includes a top portion 812, a coned portion 814, a foot base 816 affixed to a base 820 (e.g., a printed circuit board, etc.), and an interior convex portion 818. In FIG. 8A, a light source 822 is shown embedded in the foot base 816 of the flexible dome 810. In FIG. 8B, a light source 824 is shown embedded in the top portion 812 of the flexible dome 810. In this way, the light sources 822, 824 can be over molded with the material of the flexible dome 810 and protected from an exterior environment.

Light sources 822, 824 can be electrically coupled with leads or a conductive coating on or within flexible dome 110 for connecting light source 112 to a power and/or control source of an electronic device. For example, as shown in the configuration 900 of FIG. 9, the flexible dome 902 may include a light source 906 positioned on the base 904 at the interior of the flexible dome 902 (e.g., the light source 906 can be over molded with the dome material). The dome 902 may include a conductive material layer 908 disposed over the dome 902 with a lead 910 partially protruding from the material 908. The material layer 908 may be, for example, printed circuits, conductive material, traces, etc. The base 904 may be constructed of a printed circuit board and a receiving pad 912 may be positioned at the base 904 such that an electrical connection is established between the light source 906, layer 908, lead 910, base 904, and pad 912.

Figure 10A:
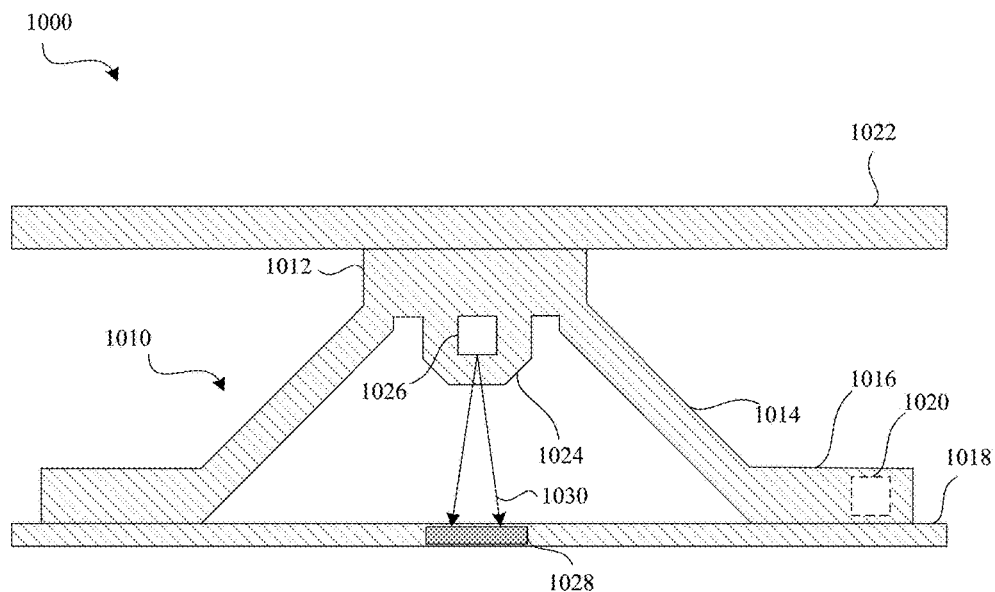
FIG. 10A is a cross-sectional side view of a dome structure including an optical sensor component according to aspects of the invention.
Figure 10B:
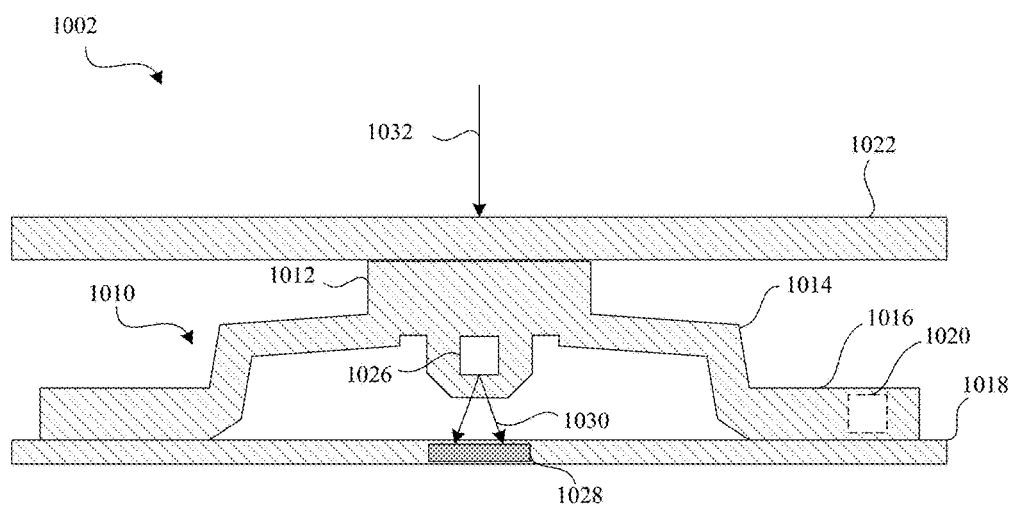
FIG. 10B is a cross-sectional side view of the dome structure of FIG. 10A in a collapsed or compressed or depressed state in accordance with various embodiments.

In additional examples, the light source can be coupled with a sensor, such as photocell (not shown) and a travel distance of light source can be detected when the flexible dome is compressed, thus providing information related to activation of the switch. These examples are shown in the configurations of FIGS. 10A and 10B. In FIGS. 10A and 10B, the key assembly may include a flexible dome 1010 (with top portion 1012, coned portion 1014, base foot 1016 and interior convex portion 1024), along with a key cap 1022 and an optional light source 1020 over molded in the base foot 1016 (and/or positioned in other manners as is disclosed herein). The base 1018 of the key assembly may include an optical component (e.g., a detector, photo-resistor, etc.). Molded in the interior convex portion 1024 may be positioned a light source 1026. The light source 1026 may be configured to emit IR light toward the optical component 1028.

In an uncompressed state 1000, the light source 1026 emits IR light 1030 that is detected by the optical component 1028 to be at a certain distance corresponding to a distance associated with the key being uncompressed. In a compressed state 1002 (e.g., when a force 1032 acting on the key cap 1022 causes the dome 1010 to collapse), the light source 1026 emits IR light 1030 that is detected by the optical component 1028 to be at a certain distance corresponding to a distance associated with the key being compressed. Thus, when the optical component 1028 detects the light from the light source 1026 to travel a distance associated with the compressed state 1002, the optical component 1028 may generate a signal or output to a controller or processor of the system indicating that the key has been activated, such that the controller or processor initiates the function associated with the activated key (e.g., inputting the corresponding data). Put alternatively, a light source 1026 may be over molded or otherwise positioned within (partially or fully) the flexible dome 1010 such that an optical switch may be constructed. In this way, the first and second contacts of the input button, described in previous embodiments could be eliminated.

Figure 11A:
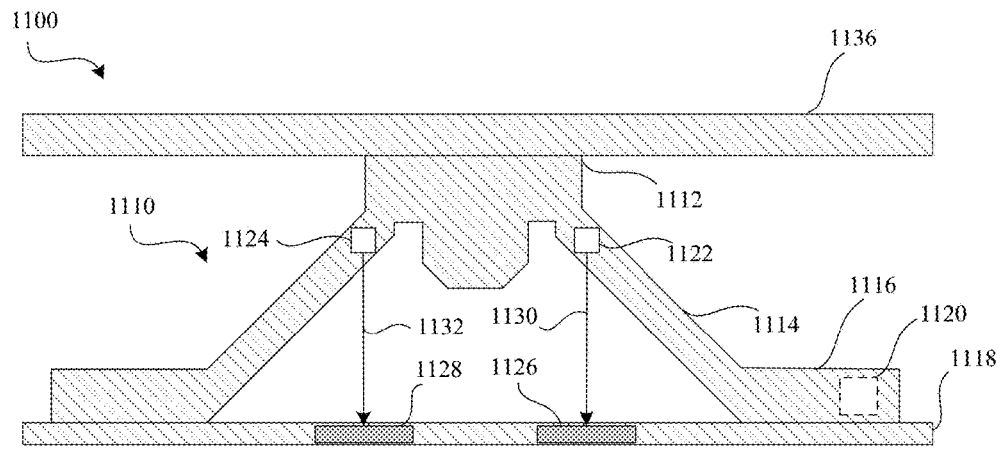
FIG. 11A is a cross-sectional side view of a dome structure having optical sensor components in various locations in accordance with aspects of the invention.
Figure 11B:
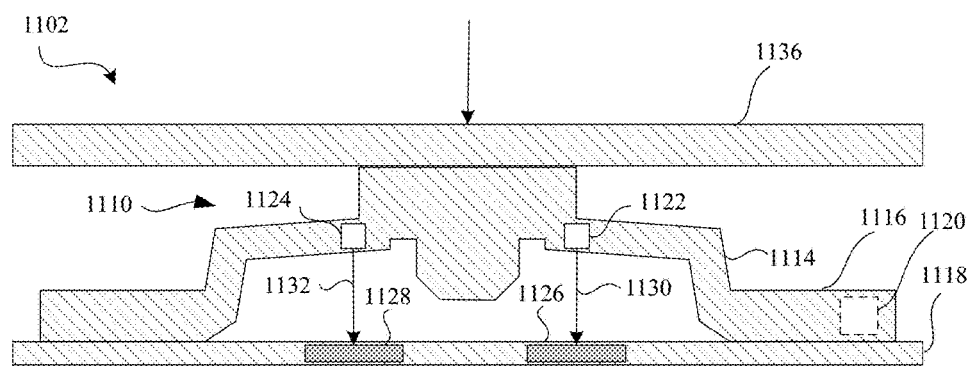
FIGS. 11B and 11C are cross-sectional side views of the dome structure of FIG. 11A in various collapsed, compressed, or depressed states according to the described embodiments.
Figure 11C:
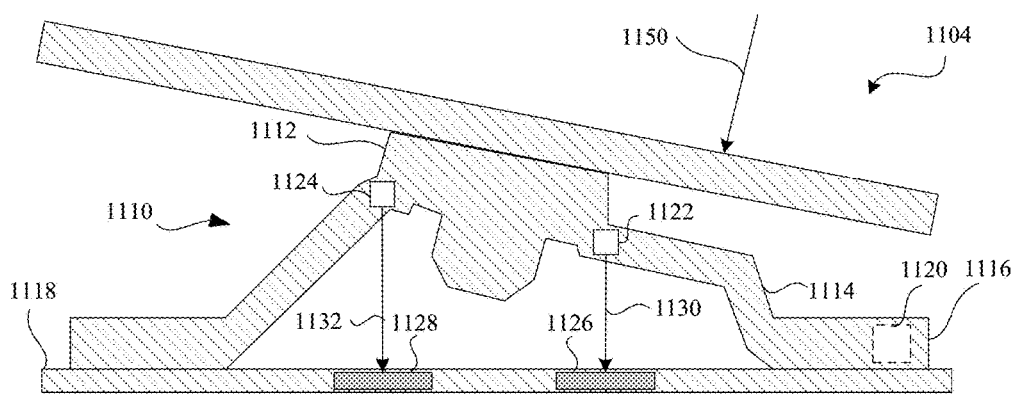

Additional examples of light sources configured as optical switches are shown in FIGS. 11A-11C. The key assembly is shown in an uncompressed state 1100, a compressed state 1102, and a partially compressed state 1104. The key assembly includes a flexible dome 1110 (with a top portion 1112, a coned portion 1114 and a base foot 1116), a key cap 1122, a light source 1120, and a key base 1118 with optical sensors/components 1126 and 1128 positioned therein. It will be recognized that although the embodiments depict the optical components positioned within the key bases, the components may be placed in other suitable positions in order to effectuate an optical switch.

The key assembly includes at least two light sources 1124 and 1126, which may be configured to emit light 1130 and 1132 (e.g., IR light or other detectable light) to be detected by the optical components 1126 and 1128 respectively. Each detector may be configured to determine a distance corresponding to a compressed state and an uncompressed state. For example, at state 1100, the detectors 1126 and 1128 may be configured to detect light from the light sources 1122 and 1124 to be at a distance associated with an uncompressed state. At state 1102, the detectors 1126 and 1128 may detect the light to be at a distance associated with a compressed state. At state 1104, however, when the key cap 1122 is acted upon by a force 1150, the key cap transitions to a compressed state. Thus, the distance measured by detector 1126 may indicate the compressed state while the distance measured by the detector 1128 may indicate an uncompressed state. A system associated with key assemblies such as those depicted in FIGS. 11A and 11C may be configured to output particular signals or cause certain functions when a partially compressed state is detected. For example, the system may treat the key as compressed, may treat the key as uncompressed, may prompt the user via an application that the key was not fully compressed, may cause a particular illumination of the key from a light source, etc.

Figure 12A:
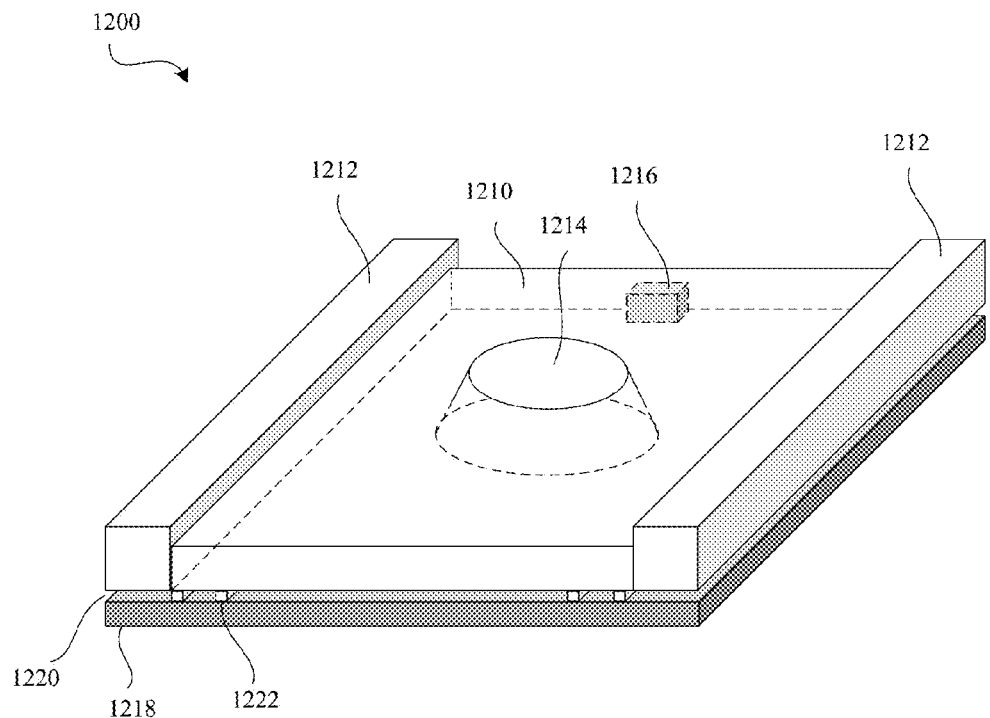
FIG. 12A is an isometric view of an illuminated dome and key structure according to aspects of the invention.
Figure 12B:
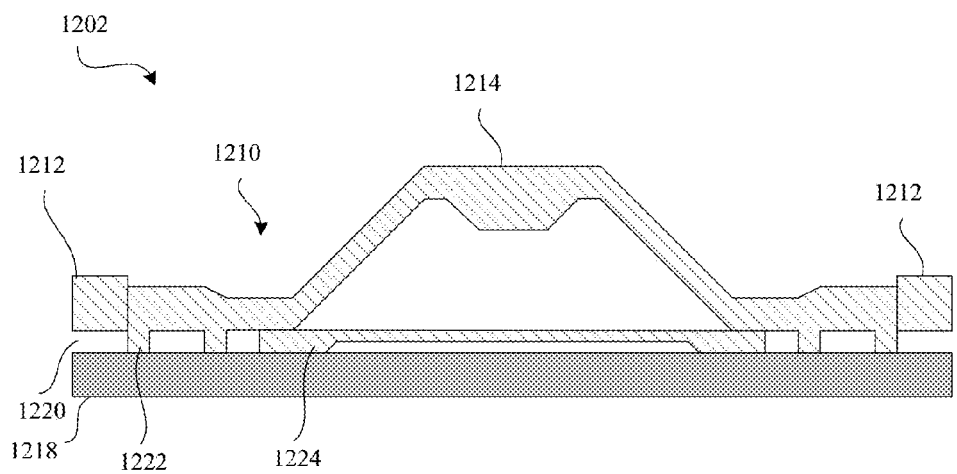
FIG. 12B is a cross-sectional side view of the dome and key structure of FIG. 12A.

FIGS. 12A and 12B are views of a key arrangement where a larger part of the key includes the material of the flexible dome. The key arrangement is shown in an isometric view 1200 and a cross-sectional side view 1202. The key arrangement includes end caps 1212 and a molded structure 1210 between the end caps 1212. A flexible dome 1214 may be positioned at about the center of the molded structure 1210 and may be formed as part of the molded structure 1210. A light source 1216 is disposed within the molded structure 1210 (or alternatively, molded over by the molded structure 1210 during formation of the molded structure 1210). The key assembly also includes a base 1218 and protrusions 1222 extending from the bottom of the molded structure 1210 to the top of the base 1218 such that the protrusions 1222 are positioned within a gap 1220 between the base 1218 and the molded structure 1210. The molded structure 1210 may be constructed of a translucent material or other light transmitting material to facilitate transmission of light from the light source 1216 throughout the molded structure 1210. For example, the molded structure 1210 may be formed of a clear or partially clear rubber material that may also seal the key assembly from outside sources such as water.

The protrusions 1222 may elevate the molded structure 1210 from the base 1218 such that the flexible dome 1214 is separated from an electronic trigger or switch 1224 disposed beneath the flexible dome 1214. A key cap (not shown) may be positioned or placed above the flexible dome 1214 such that, when a force is applied to the key cap, the flexible dome 1214 may collapse, making contact with the trigger 1224, thereby completing or activating a switch for the key arrangement. An optical switch, such as those described above, may be utilized with the molded structure 1210 in place of or in addition to the switch 1224.

Figure 13A:
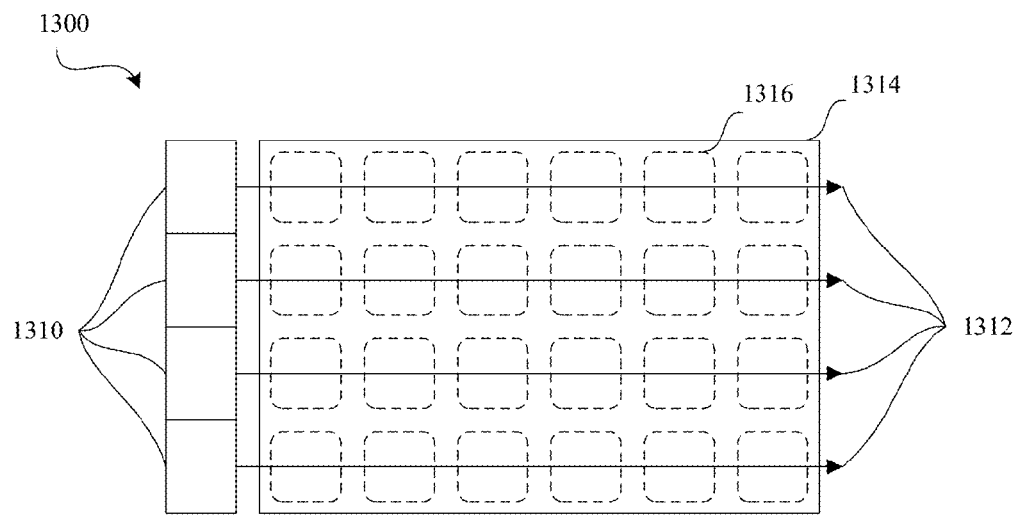
FIG. 13A is a diagram of a top view of an illuminated input array.

FIG. 13A shows a key configuration 1300 similar to that used with the configuration shown in FIG. 2A. The key configuration 1300 includes an array 1314 of keys 1316 arranged in line with light sources 1310. Each line in the array 1314 of keys 1316 may have associated with it one light source from the light sources 1310. Each light source projects light 1312 for illumination of the keys 1316. As described above, such an arrangement 1300 may result in light loss due to the light guides beneath the array 1314 and/or loss of uniformity due to each light source having to light a substantial number of keys in the array 1314. Also, such configurations may not permit tunable light solutions.

Figure 13B:
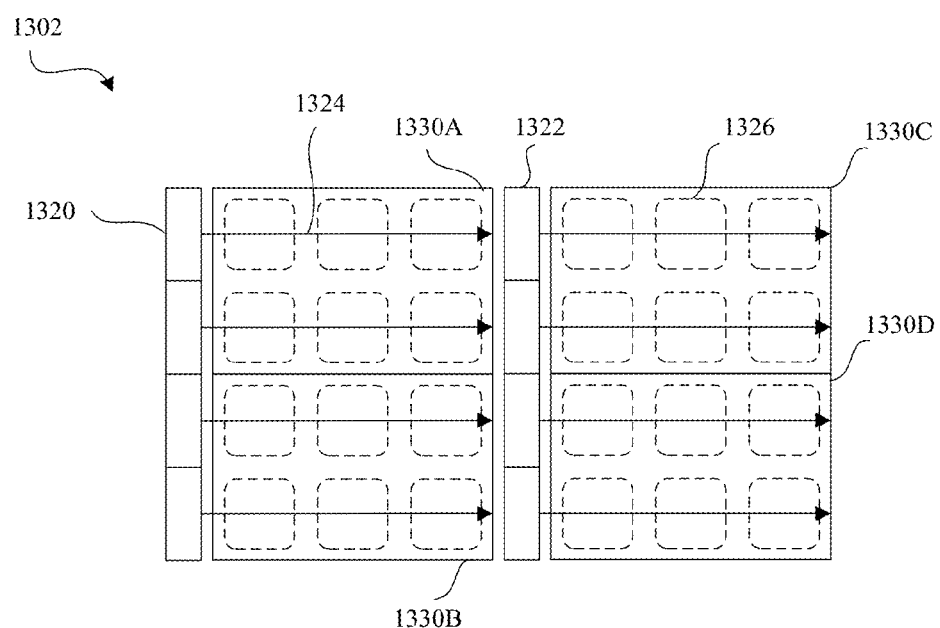
FIG. 13B is a diagram of a top view of an illuminated input array that is partitioned in accordance with the various embodiments.

FIG. 13B, the configuration 1302 shows a partitioned array, where the array is partitioned into sections 1330A, 1330B, 1330C and 1330D. Light sources 1320 and 1322 may be utilized and may be, for example, micro-LEDs as opposed to larger sized LEDs used to illuminate a substantial number of keys. Light sources 1320 may produce light 1324 and light sources 1322 may produce light 1326. Since each light source is responsible for the illumination of fewer keys, more uniform light distribution can be achieved and better tuning may be utilized (e.g., lighting different partitions to different luminosity or colors).

Figure 14:
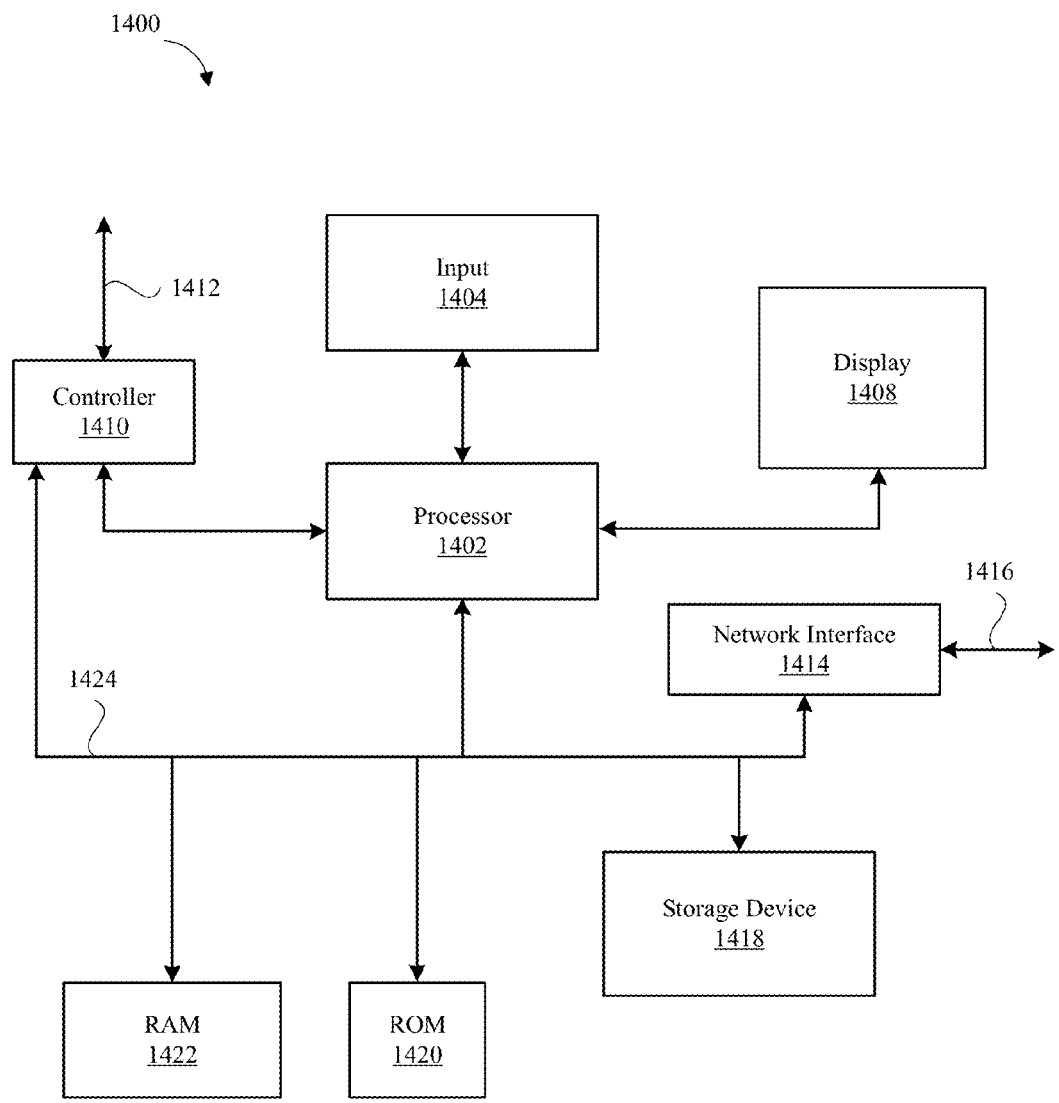
FIG. 14 illustrates a block diagram of a computing device that can include illuminating switches of the describe embodiments.

FIG. 14 is a block diagram of a computing device 1400 that can use the switches of the disclosed embodiments. It will be appreciated that the components, devices or elements illustrated in and described with respect to FIG. 14 may not be mandatory and thus some may be omitted in certain embodiments. The computing device 1400 can include a processor 1402 that represents a microprocessor, a coprocessor, circuitry and/or a controller for controlling the overall operation of the computing device 1400. Although illustrated as a single processor, it can be appreciated that the processor 1402 can include a plurality of processors. The plurality of processors can be in operative communication with each other and can be collectively configured to perform one or more functionalities of the computing device 1400 as described herein. In some embodiments, the processor 1402 can be configured to execute instructions that can be stored at the computing device 1400 and/or that can be otherwise accessible to the processor 1402. As such, whether configured by hardware or by a combination of hardware and software, the processor 1402 can be capable of performing operations and actions in accordance with embodiments described herein.

The computing device 1400 can also include a user input device 1404 that allows a user of the computing device 1400 to interact with the computing device 1400. For example, the user input device 1404 can take a variety of forms, such as a button, keypad, dial, touch screen, audio input interface, visual/image capture input interface, input in the form of sensor data, etc. Such user input can utilize the switches of the described embodiments herein. Still further, the computing device 1400 can include a display 1408 (screen display) that can be controlled by the processor 1402 to display information to a user. A controller 1410 can be used to interface with and control different equipment through an equipment control bus 1412. The computing device 1400 can also include a network/bus interface 1414 that couples to a data link 1416. The data link 1416 can allow the computing device 1400 to couple to a host computer or to accessory devices. The data link 1416 can be provided over a wired connection or a wireless connection. In the case of a wireless connection, network/bus interface 1414 can include a wireless transceiver.

The computing device 1400 can also include a storage device 1418, and a storage management module that manages one or more partitions (also referred to herein as "logical volumes") within the storage device 1418. In some embodiments, the storage device 1418 can include flash memory, semiconductor (solid state) memory or the like. Still further, the computing device 1400 can include Read-Only Memory (ROM) 1420 and Random Access Memory (RAM) 1422. The ROM 1420 can store programs, code, instructions, utilities or processes to be executed in a non-volatile manner. The RAM 1422 can provide volatile data storage, and store instructions related to components of the storage management module that are configured to carry out the various techniques described herein. The computing device 1400 can further include data bus 1424. The data bus 1424 can facilitate data and signal transfer between at least the processor 1402, the controller 1410, the network/bus interface 1414, the storage device 1418, the ROM 1420, and the RAM 1422.The various aspects, embodiments, implementations or features of the described embodiments can be used separately or in any combination.

Figure 15:
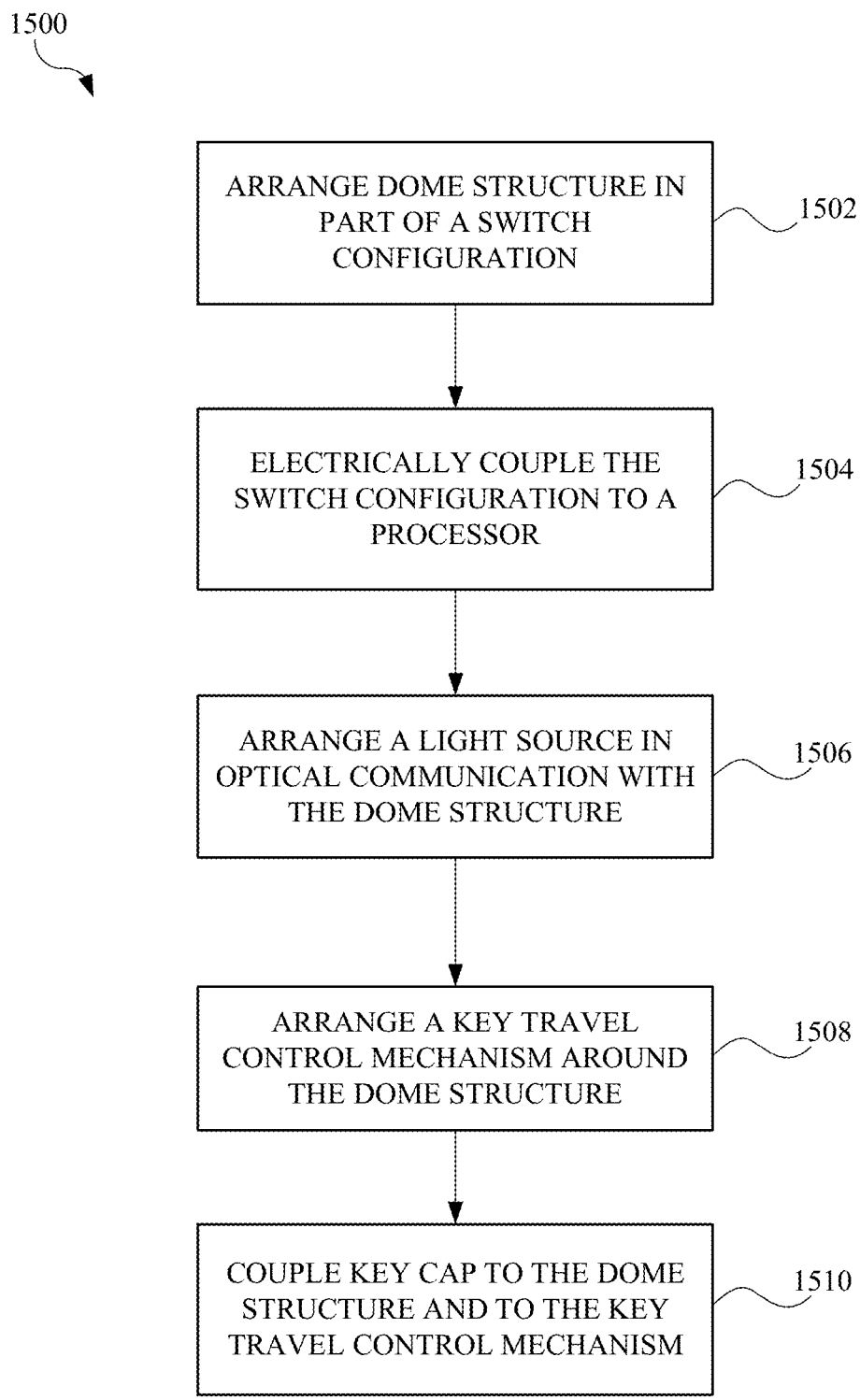
FIG. 15 illustrates a block diagram of a method for assembling illuminating switches in accordance with the described embodiments.

FIG. 15 illustrates a block diagram of a method 1500 for assembling switches of the described embodiments. In a step 1502, a flexible dome capable of collapsing under an applied force and having light transmitting characteristic can be arranged as part of a switch configuration. For example, the flexible dome may be arranged such that a first contact coupled to the flexible dome is opposite a second contact and such that the first contact can touch the second contact when the flexible dome is collapsed under the applied force. In a step 1504, the switch configuration (e.g., the first contact and second contact) can be electrically coupled to a processor such that when the contacts touch a circuit is completed and a signal is sent to the processor. In a step 1506, a light source can be arranged to be in optical communication with the flexible dome, the light source configured to emit visible light into the flexible dome, the flexible dome configured to internally transmit visible light emitted by the light source and subsequently emit the visible light. The light source may be over molded by the flexible dome and/or by the material from which the flexible dome is formed. In a step 1508, a key cap scissor mechanism (e.g., a key travel control mechanism) can be arranged around the flexible dome. The key travel control mechanism may control vertical or other displacement of the key when acted upon by outside forces. In a step 1510, a key cap can be coupled to the flexible dome and to the scissor mechanism.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A dome switch assembly, comprising: a first contact carried by a base; a dome shaped structure coupled to and supported by the base, the dome shaped structure comprising a material that is flexible and capable of internally transmitting visible light; a second contact coupled to the dome shaped structure and arranged opposite the first contact; wherein the second contact completes a circuit with the first contact when the flexible dome shaped structure is collapsed under an applied force; and a light source configured to emit visible light, the light source embedded within and in optical communication with the material of the dome shaped structure such that at least some of the visible light emitted by the light source passes into the material and is subsequently emitted by the material in a generally uniform manner.

2. The dome switch assembly of claim 1, wherein the light source is arranged at a base of the dome shaped structure and is electrically coupled to a lead configured to at least transmit power to the light source.

3. The dome switch assembly of claim 1, further comprising a key cap having an input surface and arranged over the dome shaped structure, wherein the visible light emitted by the dome shaped structure illuminates the key cap.

4. The dome switch assembly of claim 3, wherein the key cap is configured to transmit at least some of the visible light emitted by the dome shaped structure to the input surface.

5. The dome switch assembly of claim 4, wherein the key cap includes masking that defines indicia at the input surface, the masking configured to block the visible light transmitted to the input surface and the indicia configured to emit the visible light transmitted through the key cap at the indicia.

6. The dome switch assembly of claim 1, wherein the dome shaped structure comprises light guiding features to control where visible light is emitted from the dome shaped structure.

7. The dome switch assembly of claim 1, wherein the dome shaped structure comprises masking at a portion of the dome shaped structure to prevent visible light from emitting from the portion of the dome shaped structure.

8. The dome switch assembly of claim 1, wherein the dome shaped structure is made of a translucent rubber material.

9. The dome switch assembly of claim 1, wherein the light source is an LED.

10. The dome switch assembly of claim 1, further comprising multiple light sources.

11. An illuminated keyboard for a computing device, the illuminated keyboard comprising:
    a keyboard base suitable for carrying multiple input keys, each input key having a key cap arranged to interact with a dome assembly, the dome assembly comprising:
        a first contact carried by a base;
        a translucent dome supported by the keyboard base;
        a second contact coupled to the translucent dome and arranged opposite the first contact, wherein the second contact completes a circuit with the first contact when the translucent dome is collapsed under an applied force; and
        a light source embedded within and directly contacting a material of the translucent dome and configured to emit light into the material of the translucent dome such that at least some of the light emitted by the light source is emitted by the translucent dome and illuminates the key cap.

12. The illuminated keyboard of claim 11, wherein the key cap includes masking that defines indicia, the indicia configured to transmit a portion of the light emitted from the translucent dome and the masking configured to block transmission of a portion of the light emitted from the translucent dome.

13. The illuminated keyboard of claim 11, wherein the light source is embedded within and directly contacting the material of the translucent dome by being over molded with the material of the translucent dome.

14. The illuminated keyboard of claim 11, wherein the dome assembly further comprises a scissor mechanism coupled to both a housing and the key cap such that the key cap is capable of travelling along a controlled path when receiving an input force from a user.

15. The illuminated keyboard of claim 11, wherein the translucent dome comprises light guiding features within the translucent dome to control locations from which light is emitted from the translucent dome.

16. A method for assembling an illuminated keyboard comprising:
    arranging a flexible dome capable of collapsing under an applied force and having light transmitting characteristic such that a first contact coupled to the flexible dome is opposite a second contact and such that the first contact can touch the second contact when the flexible dome is collapsed under the applied force;
    electrically coupling the first contact and the second contact to a processor such that when the first and second contacts touch, a circuit is completed and a signal is sent to the processor; and
    arranging a light source to be embedded within a material of, and in optical communication with, the flexible dome, the light source configured to emit visible light into the material of the flexible dome, the flexible dome configured to internally transmit visible light emitted by the light source and subsequently emit the visible light.

17. The method of claim 16, further comprising arranging a key cap scissor mechanism around the flexible dome.

18. The method of claim 17, further comprising coupling a key cap to the flexible dome and to the scissor mechanism.

19. The method of claim 17, wherein the flexible dome comprises a translucent rubber material.

* * * * *

UNITED STATES PATENT AND TRADEMARK OFFICE
CERTIFICATE OF CORRECTION

PATENT NO. : 10,199,184 B2
APPLICATION NO. : 15/447070
DATED : February 5, 2019
INVENTOR(S) : Paul X. Wang et al.

It is certified that error appears in the above-identified patent and that said Letters Patent is hereby corrected as shown below:

In the Specification

Column 6, Line 16: "button 102" should read -- button 104 --.

Column 7, Line 10: "gap 214 which is used" should read -- gap which is used --.

Column 8, Line 5: "A button plate 310" should read -- A button plate 314 --.

Column 8, Line 19: "the walls of the dome 3109" should read -- the walls of the dome 310 --.

Column 9, Line 7: "a base potion 410" should read -- a base portion 410 --.

Column 10, Line 10: "light source can be arranged in housing 514" should read -- light source can be arranged in housing 542 --.

Column 10, Line 11: "arranged external to housing 514" should read -- arranged external in housing 542 --.

Signed and Sealed this
Fifth Day of March, 2019

Andrei Iancu
*Director of the United States Patent and Trademark Office*